United States Patent
Le Tiec et al.

(10) Patent No.: US 9,076,732 B2
(45) Date of Patent: Jul. 7, 2015

(54) METHOD TO PREPARE SEMI-CONDUCTOR DEVICE COMPRISING A SELECTIVE ETCHING OF A SILICIUM—GERMANIUM LAYER

(71) Applicant: COMMISSARIAT A L'ENERGIE ATOMIQUE ET AUX ENERGIES ALTERNATIVES, Paris (FR)

(72) Inventors: Yannick Le Tiec, Crolles (FR); Laurent Grenouillet, Rives (FR); Nicolas Posseme, Carantec (FR); Maud Vinet, Rives (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 13/628,318

(22) Filed: Sep. 27, 2012

(65) Prior Publication Data
US 2013/0109191 A1  May 2, 2013

(30) Foreign Application Priority Data

Sep. 28, 2011 (FR) ...................................... 11 58674

(51) Int. Cl.
| | |
|---|---|
| H01L 21/302 | (2006.01) |
| H01L 21/461 | (2006.01) |
| H01L 21/306 | (2006.01) |
| H01L 21/3213 | (2006.01) |
| H01L 21/8238 | (2006.01) |
| H01L 21/02 | (2006.01) |
| H01L 21/311 | (2006.01) |
| C09K 13/00 | (2006.01) |

(52) U.S. Cl.
CPC .... *H01L 21/30604* (2013.01); *H01L 21/32134* (2013.01); *H01L 21/311* (2013.01); *C09K 13/00* (2013.01); *H01L 21/31111* (2013.01); *H01L 21/823807* (2013.01); *H01L 21/02057* (2013.01)

(58) Field of Classification Search
None
See application file for complete search history.

(56) References Cited

U.S. PATENT DOCUMENTS

2005/0260830 A1* 11/2005 Kwon et al. .................. 438/478
2009/0263970 A1* 10/2009 Bai et al. ...................... 438/675

* cited by examiner

*Primary Examiner* — Duy Deo
(74) *Attorney, Agent, or Firm* — Oblon, McClelland, Maier & Neustadt, L.L.P.

(57) ABSTRACT

The present invention relates to a method for manufacturing a semiconductor device by wet-process chemical etching, the device comprising at least one layer of silicon (Si) and at least one layer of silicon-germanium (SiGe) and at least one layer of photosensitive resin forming a mask partly covering the layer of silicon-germanium (SiGe) and leaving the layer of silicon-germanium uncovered in certain zones, characterized in that it comprises a step of preparation of an etching solution, having a pH between 3 and 6, from hydrofluoric acid (HF), hydrogen peroxide ($H_2O_2$), acetic acid ($CH_3COOH$) and ammonia ($NH_4OH$), and a step of stripping of the layer of silicon-germanium (SiGe) at least at the said zones by exposure to the said etching solution. The invention will be applicable for the manufacture of integrated circuits and more precisely of transistors. In particular, for optimization of CMOS transistors of the latest generation.

16 Claims, 2 Drawing Sheets

METHOD TO PREPARE SEMI-CONDUCTOR DEVICE COMPRISING A SELECTIVE ETCHING OF A SILICIUM—GERMANIUM LAYER

The present invention relates to a method for manufacturing a semiconductor device with a step of selective stripping of a layer of silicon-germanium.

The invention will be applicable for the manufacture of integrated circuits and more precisely of transistors. In particular, for optimization of CMOS transistors (semiconductor with complementary metal oxide or Complementary Metal Oxide Semiconductor in English) of the latest generation, it is advantageous to provide a silicon-germanium (SiGe) channel for the PMOS part (semiconductor with metal oxide with positive channel or Positive Metal Oxide Semiconductor in English). Nevertheless, this layer has no relevance for an NMOS transistor (semiconductor with metal oxide with negative channel or Negative Metal Oxide Semiconductor in English). The manufacture of these two types of transistor, PMOS and NMOS, may be combined. In a first step, a PMOS transistor is made on a layer of silicon-germanium, then the NMOS is prepared. For that, the PMOS is masked by a layer of resin, so as to be protected. Then the silicon-germanium must be eliminated locally through the resin mask in the zones intended to receive an NMOS. This stripping of silicon-germanium must be selective with respect to the lower layers and the resin.

Dry plasma etching is known for this purpose. Despite advantageous selectivity, the cost of this technology does not permit its use on a large scale.

A treatment based on gaseous hydrochloric acid (HCl) may also be carried out in a reactor. This technique is not applicable to all transistors, because the selectivity varies greatly as a function of the percentage of germanium in the layer of silicon-germanium to be eliminated.

Wet-process etching tests have been carried out with solutions of hydrofluoric acid (HF), hydrogen peroxide ($H_2O_2$) and acetic acid ($CH_3COOH$).

Wet-process etching is not satisfactory for eliminating a layer of silicon-germanium, especially in the presence of a resin mask.

In fact, it has been proved that this type of solution attacks part of the resin. In particular, the flanks of the patterns formed in the resin are damaged. Consequently, the dimension of the patterns is not very well controlled.

The need therefore exists to propose a method for eliminating a layer of silicon-germanium by a wet process and preferably with satisfactory selectivity and without significantly damaging a resin mask.

For this purpose, the present invention relates to a method for manufacturing a semiconductor device by wet-process chemical etching, the device comprising at least one layer of silicon (Si) and at least one layer of silicon-germanium (SiGe) and at least one layer of photosensitive resin forming a mask partly covering the layer of silicon-germanium (SiGe) and leaving the layer of silicon-germanium uncovered in certain zones, characterized in that it comprises a step of stripping of the layer of silicon-germanium (SiGe) at least at the said zones by exposure to an etching solution. The etching solution, which has a pH between 3 and 6, is advantageously formed by a step of preparation from hydrofluoric acid (HF), hydrogen peroxide ($H_2O_2$), acetic acid ($CH_3COOH$) and ammonia ($NH_4OH$).

The combination of these four components in the etching solution makes it possible to obtain a step of stripping, preferably selectively, of the layer of silicon-germanium. The pH of the etching solution is designed both to be compatible with a resin mask and to permit selective stripping of the layer of silicon-germanium. In fact, for a person skilled in the art, these objectives seem opposed a priori; the pH for not damaging a resin is advantageously around 3 to 6, whereas the concentration of etching species for achieving selective stripping must be maximum, in other words around a pH of 1 to 2.

According to the invention, the addition of ammonia ($NH_4OH$) to a solution containing hydrofluoric acid (HF) is not usually envisioned, since this mixture readily leads to formation of ammonium fluoride salt ($NH_4F$). The presence of this salt not only induces defective character on the semiconductor plate but also damage to the equipment by blocking the conduits.

Furthermore, the acid-base mixture in such an etching solution commonly generates a strongly exothermal condition, which creates problems of nonuniformity of etching. In addition, the more an etching solution contains compounds, the more the problems associated with uniformity of etching are amplified.

According to the invention, these disadvantages are at least partly alleviated by the present method and its etching solution.

Preferably the etching solution according to the invention is diluted by a factor of between 5 and 500. This dilution leads to numerous advantages, including control of the etching rate and better etching. The dilution factor is calculated relative to the total volume of etching solution before dilution.

The method according to the invention permits stripping of zones of silicon-germanium with very good selectivity relative to the other layers of the transistor and with little or no damage to the resin mask.

According to a preferred option, the method comprises at least a step of pretreatment and/or a step of post-treatment respectively before and after the stripping step.

It is very advantageous to provide at least one preliminary treatment step, or pretreatment step, thus facilitating startup of the stripping step. Similarly, the post-treatment step advantageously improves the surface texture of the layer situated under the stripping zones by removing potential contaminants, more particularly the silicon oxide in the case of total stripping of the layer of silicon-germanium over a zone, or of silicon-germanium oxide in the case of partial stripping. This post-treatment step facilitates the possible subsequent steps of stripping of layers and/or of growth.

Preferably the solutions used for the pretreatment step and the post-treatment step are prepared by mixing hydrofluoric acid (HCl) and ammonia ($NH_4OH$).

This preparation method leads to a buffered solution having a pH consistent with use with a resin mask, in other words preferably from 3 to 6, and advantageously to selectivity toward the silicon-germanium.

According to preferred variants of the invention used in combination or alternatively, the method is such that:

the pH of the etching solution is between 3 and 6, preferably 3.5 and 4, the etching solution is prepared from hydrofluoric acid (HF), hydrogen peroxide ($H_2O_2$), acetic acid ($CH_3COOH$) and ammonia ($NH_4OH$) in respective ratios of 1/2/3/4, the etching solution is diluted in deionized water by a factor of 5 to 500, the duration of exposure to the etching solution is between 20 seconds and 600 seconds, the duration of exposure to the etching solution is between 30 seconds and 120 seconds, it comprises, before the stripping step, a pretreatment step comprising exposure of at least the said zones of the layer of silicon-germanium (SiGe) to a pretreatment solution, it comprises a step of preparation of a pretreatment solution from hydrofluoric acid (HF) and ammonia ($NH_4OH$), preferably in an NH4F/HF ratio of 2/1 to 6/1, the duration of exposure to the pretreatment solution is between 20 seconds and 300 seconds, the duration of exposure to the pretreatment solution is between 30 seconds and 120 seconds, it comprises, after the stripping step, a post-treatment step in which at least the said zones of the layer of silicon-germanium (SiGe) are exposed to a post-treatment solution, it comprises a step of preparation of a post-treatment solution from hydrofluoric acid (HF) and ammonia (NH$_4$OH), preferably in an NH4F/HF ratio of 2/1 to 6/1, the duration of exposure to the post-treatment solution is between 10 seconds and 180 seconds, the duration of exposure to the post-treatment solution is between 20 seconds and 60 seconds, the layer of silicon-germanium (SiGe) contains a germanium percentage ranging from 5 to 60%, the layer of silicon-germanium (SiGe) forms a channel of a transistor, the step of stripping of the layer of silicon-germanium (SiGe) is implemented so that the said layer of silicon-germanium (SiGe) is completely removed from the said zones, the layer of silicon (Si) being bared in these zones.

The invention also relates to a composition in which hydrofluoric acid (HF), hydrogen peroxide (H$_2$O$_2$), acetic acid (CH$_3$COOH) and ammonia (NH$_4$OH) are mixed in proportions of 1/2/3/4.

Advantageously the composition according to the invention comprises a pH between 3 and 6.

Advantageously the composition according to the invention is diluted in deionized water by a factor of 5 to 500.

The semiconductor device manufactured by the present method comprises at least one transistor.

The attached drawings are provided by way of example and are not limitative of the invention. They represent merely one embodiment of the invention and will make it possible to understand it easily.

FIG. 1 illustrates a PMOS transistor 6 on a layer of silicon-germanium 2.

Figure 1:
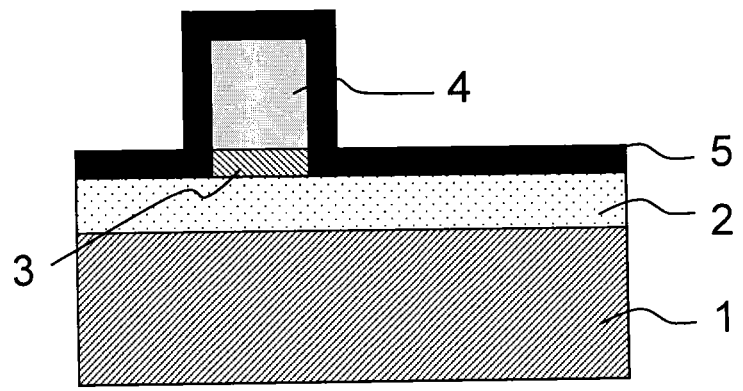
FIGS. 1 to 4 represent the different steps of manufacture of a CMOS comprising at least one PMOS transistor and at least one NMOS transistor.
Figure 2:
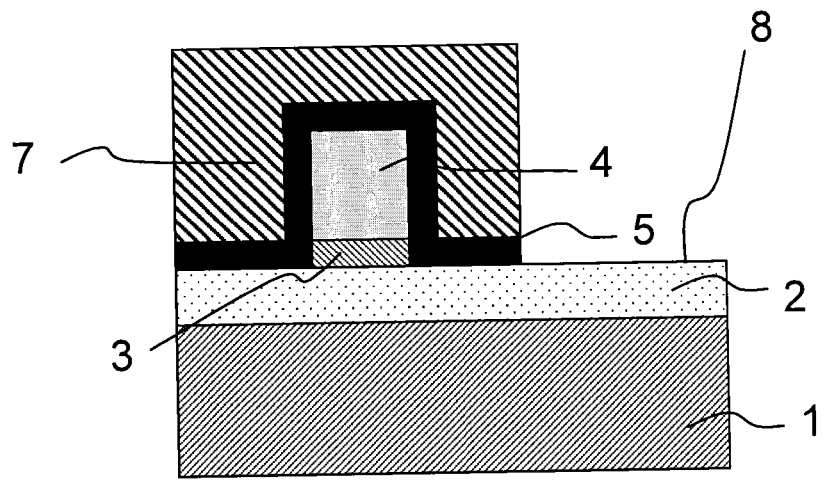

FIG. 2 illustrates the protection of PMOS transistor 6 of FIG. 1 by a layer of resin 7 for the manufacture of at least one NMOS transistor 9. Spacer 5 and resin 7 have been removed on zones 8 where the layer of silicon-germanium 2 will be removed with a view to the formation of NMOS transistor 9.

Figure 3:
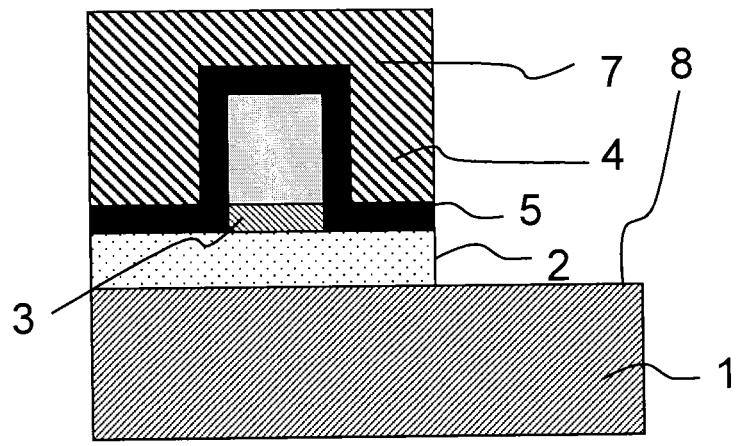

FIG. 3 illustrates a PMOS transistor 6 where the layer of silicon-germanium 2 has been removed from zones 8 intended to receive an NMOS transistor 9.

Figure 4:
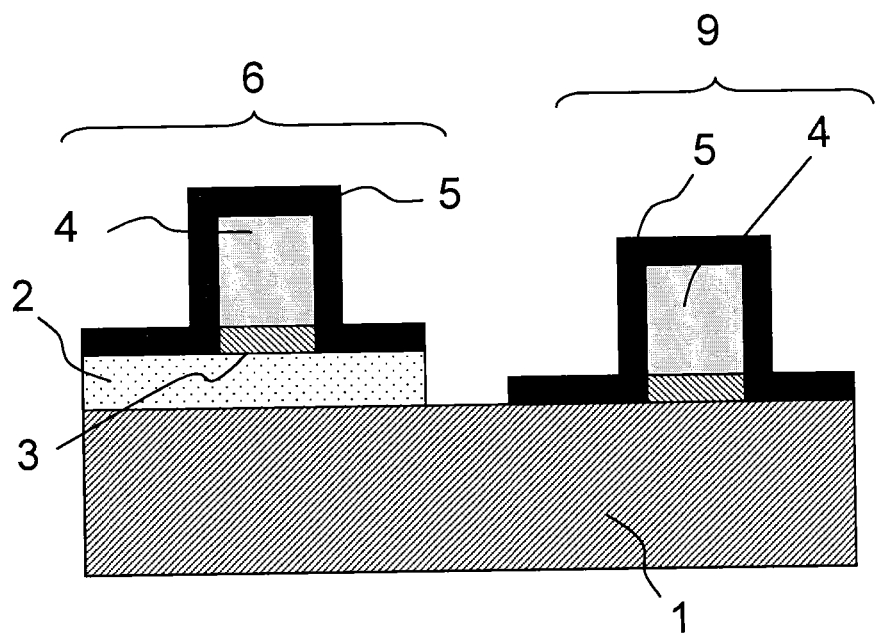

FIG. 4 illustrates a PMOS transistor 6 and an NMOS transistor 9 formed on the same substrate 1.

The device preferably comprises a substrate plate of silicon 1 or silicon on an insulator (SOI—for the English Silicon On Insulator).

To form a PMOS transistor 6, a layer of silicon-germanium 2 is deposited on the substrate of silicon 1. Silicon-germanium 2 preferably forms the channel of PMOS transistor 6.

PMOS transistor 6 comprises a gate 4, for example of polysilicon or metal, surrounded on both sides by spacers 5, for example of silicon oxide or silicon nitride. Between gate 4 and the layer of silicon-germanium 2 there is disposed a layer of silicon oxide 3 or a high-permittivity material known as "high k", such as HfO2, HfSiO, HfZrO2, Al2O3.

Once PMOS transistor or transistors 6 has or have been formed on the layer of silicon-germanium 2, a layer of resin 7, preferably photosensitive, is disposed such that it totally covers the PMOS transistor. Resin 2 is then removed at zones 8 between PMOS transistors 6. The layer of silicon-germanium 2 at zones 8 is bared so that it may be stripped partly or totally.

It is in these zones 8 that NMOS transistor 9 will be formed. Total stripping of the layer of silicon-germanium 2 at zones 8 is preferred for the formation of an NMOS transistor 6.

According to the invention, an etching solution is used to remove the layer of silicon-germanium 2. Preferably a pre-treatment solution may be applied before this layer of silicon-germanium 2 is stripped. Preferably a post-treatment solution may be applied after this layer of silicon-germanium 2 has been stripped.

NMOS transistor 9 is formed on a substrate of silicon 1 or silicon on an insulator (SOI—for the English Silicon On Insulator) and comprises a gate 4, for example of polysilicon or metal, surrounded on both sides by spacers 5, for example of silicon oxide or silicon nitride. Between gate 4 and the layer of silicon-germanium 2 there is a layer of silicon oxide 3 or a high-permittivity material known as "high k", such as HfO2, HfSiO, HfZrO2, Al2O3.

By "on" it is understood that the layers are directly in contact but also that they are covering layers, if necessary with an intermediate layer.

The stripping of the layer of silicon-germanium 2 in at least certain zones 8 in a transistor must exhibit high selectivity. In particular, the evolution of microelectronics is tending to reduce the dimensions of the nodes between the transistors, and current research efforts are aiming to achieve nodes smaller than 30 nanometers. In addition, substrate 1 of SOI is coming into general use, and in this case the upper thickness of silicon is critical; the etching of the layer of silicon-germanium 2 must be highly selective in order that the silicon of substrate 1 will not be etched. It is then essential that the precision of stripping be maximum, with very little or no damage to resin 7.

According to the invention, the etching solution is prepared by mixing hydrofluoric acid (HF), hydrogen peroxide (H$_2$O$_2$), acetic acid (CH$_3$COOH) and ammonia (NH$_4$OH).

Preferably the etching solution has a pH higher than 3 and advantageously lower than 6, advantageously between 3.5 and 4. In this pH range, it has been observed that the mask of resin 7 is not damaged by the etching solution and that the selectivity of etching of the layer of silicon-germanium 2 is satisfactory, especially with respect to the substrate of silicon 1.

Preferably resin 7 employed according to the invention is a photosensitive resin, for example made of a polymer of PolyHydroStyrene (PHS) type. Advantageously resin 7 is deposited in a layer having a thickness of 100 to 200 nm.

The proportions of the four initial components of the etching solution have been studied. Preferably the etching solution is prepared so that the ratio between the four initial components is 1/2/3/4 for HF/H$_2$O$_2$/CH$_3$COOH/NH$_4$OH respectively. The higher proportion of ammonia (NH$_4$OH) makes it possible to neutralize the acids, in other words hydrofluoric acid (HF) and acetic acid (CH$_3$COOH). The pH becomes higher. The solution formed in this way is a buffered solution, with the property of keeping its pH stable over a certain dilution range.

Preferably the hydrofluoric acid (HF) used has a strength of 49% by mass, the ammonia has a strength of 28% NH$_4$OH by mass and the acetic acid is 100% pure.

It is preferred to dilute the etching solution. The dilution is advantageously performed with deionized water. The solution is preferably diluted by a factor between 5 and 500, preferably 20 and 100.

The dilution of the solution contributes to attenuating the exothermicity during mixing of the four components (compare Examples 3 and 4). The lowering of the temperature makes it possible in particular to control the etching rate and to improve the homogeneity of etching over the entire plate by limiting the differences between the edge zones and the central zones.

The low exothermicity of the etching solution during its preparation permits almost simultaneous use. It is not necessary to schedule a waiting time between preparation and use of the etching solution.

According to the invention, the etching solution may be prepared dynamically by directly injecting the four components and the deionized water simultaneously and independently, without being mixed, or else in advance where a mixture of the four components is prepared beforehand, then injected.

The method according to the invention permits selectivity of the step of stripping of the layer of silicon-germanium 2 with respect to the layer of silicon 1, which selectivity ranges between 4/1 and 50/1 for layers of silicon-germanium containing from 5 to 60% of germanium, preferably from 10 to 60%.

The selectivity is understood as the ratio of the thicknesses of the different layers removed by the etching solution or else the ratio of the rates of etching of the different materials by the etching solution.

EXAMPLE 1

Preparation of an Undiluted Etching Solution

An etching solution is prepared without dilution according to the information below: $HF/H_2O_2/CH_3COOH/NH_4OH$ in ratios of 1/2/3/4 without addition of deionized water for dilution.

| V (H2O) cm$^3$ | V(H2O2) cm$^3$ | V (dilution) cm$^3$ | |
|---|---|---|---|
| 0 | 20 | 20 | |
| % HF | V (HF) cm$^3$ | d (HF) | n (HF) mol |
| 49 | 10 | 1.19 | 0.2916 |
| % NH4OH | V (NH4OH) cm$^3$ | d (NH4OH) | n (NH4OH) mol |
| 28 | 40 | 0.895 | 0.2860 |
| % CH3COOH | V (CH3COOH) cm$^3$ | d (CH3COOH) | n (CH3COOH) mol |
| 100 | 30 | 1.045 | 0.5221 |

Similarly, the theoretical concentrations in mol/liter of the different chemical species present in the etching solution are as follows.

| pH | [H3O+] | [HF] | [F−] | [HF2−] | [NH4+] | [CH3COO−] | [OH−] |
|---|---|---|---|---|---|---|---|
| 4.09 | 8.13E−05 | 1.45E−01 | 1.24E+00 | 7.11E−01 | 2.86E+00 | 9.20E−01 | 1.2303E−10 |

EXAMPLE 2

Preparation of a Dilute Etching Solution

An etching solution is prepared with dilution according to the information below: $HF/H_2O_2/CH_3COOH/NH_4OH$ in ratios of 1/2/3/4 with dilution in 400 cm$^3$ of deionized water. The dilution factor is 5 for a ratio that may be defined as 1/2/3/4/40.

| V (H2O) cm$^3$ | V(H2O2) cm$^3$ | V (dilution) cm$^3$ | |
|---|---|---|---|
| 400 | 20 | 420 | |
| % HF | V (HF) cm$^3$ | d (HF) | n (HF) mol |
| 49 | 10 | 1.19 | 0.2916 |
| % NH4OH | V (NH4OH) cm$^3$ | d (NH4OH) | n (NH4OH) mol |
| 28 | 40 | 0.895 | 0.2860 |
| % CH3COOH | V (CH3COOH) cm$^3$ | d (CH3COOH) | n (CH3COOH) mol |
| 100 | 30 | 1.045 | 0.5221 |

The pH and the theoretical concentrations of the different species present in the etching solution are presented in the table below:

| pH | [H3O+] | [HF] | [F−] | [HF2−] | [NH4+] | [CH3COO−] | [OH−] |
|---|---|---|---|---|---|---|---|
| 3.95 | 1.12E−04 | 5.69E−02 | 3.51E−01 | 7.90E−02 | 5.72E−01 | 1.40E−01 | 8.9125E−11 |

By virtue of the method of preparing the etching solution according to the invention, the etching solution is a buffered solution. The dilutions make it possible to adapt the etching rates without notable modification of the pH of the solution, since it is buffered.

EXAMPLE 3

Stripping Step

An etching solution is prepared using the amounts below. The concentrations of the different components are close to those of Example 1.

| v (HF) | V (H2O2) | v (CH3COOH) | v (NH4OH) | v (DI) | v Total | pH |
|---|---|---|---|---|---|---|
| 10 | 20 | 30 | 40 | 100 | 200 | 4.03 |

The etching solution prepared in this way is used on:
a layer of 28 nm of silicon-germanium (SiGe) 30%,
a layer of 74 nm of silicon-germanium (SiGe) 20%,
a layer of 45 nm of silicon (Si).

| Exposure time | T° C. | Removed thickness |
|---|---|---|
| 2 minutes | 50 | All layers are removed |

The etching solution exhibits considerable exothermicity. Since the etching rate is too high, it is not possible to calculate the selectivity of the solution.

The thicknesses of the layers are measured by ellipsometry.

EXAMPLE 4

Stripping Step

An etching solution is prepared using the amounts below. The concentrations of the different components are close to those of the example

| v (HF) | V (H2O2) | v (CH3COOH) | v (NH4OH) | v (DI) | v Total | pH |
|---|---|---|---|---|---|---|
| 10 | 20 | 30 | 40 | 400 | 500 | 3.95 |

The etching solution prepared in this way is used on:
a layer of 28 nm of silicon-germanium (SiGe) 30%,
a layer of 74 nm of silicon-germanium (SiGe) 20%,
a layer of 45 nm of silicon (Si).

| Exposure time | T° C. | Removed thickness |
|---|---|---|
| 1 minute | 35 | 2.9 nm of Si for 12 nm of SiGe 20% |

With this solution it is possible to etch the layer of silicon-germanium (SiGe) 20% selectively with a selectivity on the order of 1/4 with respect to the silicon (Si).

The thickness removed from the layers of silicon and silicon-germanium can be controlled by also shortening the exposure duration.

Without being bound to a theory, this selectivity could be explained by the fact that the etching solution contains components that form oxidizing species, specifically hydrogen peroxide (H2O2) and acetic acid (CH3COOH), which form peracetic acid (CH3CO3H), which has strong oxidizing power.

Once the four components have been mixed and the reaction has reached equilibrium, the following species are found in the etching solution: hydronium ion (H3O+), hydrofluoric acid (HF), fluoride ion (F—), hydrogen difluoride ion (HF2-), ammonium ion (NH4+), hydroxide ion (OH—).

The etching solution also contains components that form etching species, specifically hydrofluoric acid (HF) and ammonia (NH4OH), which form species exhibiting high etching power.

The addition of ammonia (NH4OH) raises the pH of the etching solution and reduces the effectiveness of etching, but the ammonia (NH4OH) reacts in particular with the hydrofluoric acid (HF) to produce ammonium fluoride (NH4F) in the form of ammonium ion/fluoride ion (NH4+/F—), which contributes to the etching of the silicon-germanium by formation of hydrogen difluoride (HF2-) between the hydrofluoric acid (HF) and the fluoride ion (F—).

During the stripping step, the phenomena of oxidation and etching follow one another repetitively.

The stripping step has a duration between 20 and 600 seconds, depending on the etching rate of the solution and the thickness of the layer to be removed. Preferably it lasts 30 to 120 seconds, advantageously on the order of 60 seconds.

According to a preferred embodiment of the invention, the method for manufacturing the semiconductor device also comprises at least one pretreatment step. This pretreatment step is carried out before the stripping step. It consists in exposing zones 8 of the layer of silicon-germanium 2 (SiGe) to be removed to a pretreatment solution. During this pretreatment step, the layer of resin 7 is preferably already in place. The pretreatment solution is therefore advantageously compatible with the layer of resin 7. This pretreatment step advantageously makes it possible to eliminate any contaminants that may be present at the surface of the layer of silicon-germanium 2 to be removed. Among the components, traces of silicon oxides are removed by the pretreatment solution. In fact, it is preferred that the layer of silicon-germanium 2 (SiGe) is not contaminated or oxidized before the stripping step. Otherwise, during the stripping step, etching does not begin simultaneously over the entire surface of the zones to be removed, and inhomogeneous stripping then takes place.

The duration of exposure in the pretreatment step is 20 to 300 seconds, preferably 30 to 120 seconds, advantageously on the order of 40 seconds.

The pretreatment solution has a pH of preferably between 3 and 5, advantageously on the order of 3. It advantageously contains hydrofluoric acid (HF). The pretreatment solution advantageously has an NH4F/HF ratio ranging from 2/1 to 500/1, preferably from 2/1 to 30/1, even more preferably from 2/1 to 6/1.

Preferably the pretreatment solution is formed from hydrofluoric acid (HF) and ammonia (NH4OH). The solvent is typically deionized water. The reaction between these two species is almost total, with formation of an ammonium fluoride salt (NH4F). If the hydrofluoric acid (HF) is present in excess, the reaction is limited by the amount of ammonia (NH4OH) initially introduced, so that the final solution at equilibrium corresponds to a mixture of hydrofluoric acid (HF) and ammonium fluoride (NH4F). The solution is buffered. This preparation method makes it possible to obtain a solution having a pH compatible with a resin mask and to dilute it by a large factor while retaining a suitable pH. The solution is diluted by a factor of 5 to 100, preferably approximately 50. The ammonium fluoride salt (NH4F) is advantageously in dissolved form (NH4+/F—).

According to an embodiment combined with or alternative to the foregoing, the method comprises at least one post-treatment step. This post-treatment step is carried out after the stripping step. It consists in exposing zones 8 of the layer of silicon-germanium 2 (SiGe) that were totally or partly removed during the stripping step to a post-treatment solution. This step contributes to eliminating any contaminants that may be left on the surface of the said zones at the end of the stripping step. These contaminants may include oxides of silicon, silicon-germanium and/or residual components of the etching solution. This step consists in cleaning the said zones 8 so as to permit a new stripping step, such as described hereinabove, or else a step of layer growth.

The duration of exposure in the post-treatment step is between 10 and 180 seconds, preferably from 20 to 60 seconds and advantageously on the order of 20 seconds.

The post-treatment solution is preferably identical to the pretreatment solution described hereinabove.

According to an advantageous possibility, the method sequentially comprises a pretreatment step, a stripping step and a post-treatment step. It may be advantageous to provide a plurality of these steps. By way of example, the method sequentially comprises a pretreatment step, a stripping step, a post-treatment step, a stripping step and a post-treatment step. The number of stripping steps and therefore of pretreatment and post-treatment steps depends on the thickness and number of layers to be removed.

In a preferred example, the method comprises a pretreatment step having a duration on the order of 30 to 90 seconds, preferably on the order of 60 seconds, a stripping step having a duration on the order of 30 to 180 seconds, preferably on the order of 60 to 120 seconds and a post-treatment step having a duration on the order of 20 to 90 seconds, preferably on the order of 20 to 60 seconds.

EXAMPLE 5

Method for Manufacturing a Semiconductor Device

An etching solution is prepared according to Example 2.

A pretreatment solution and a post-treatment solution are respectively prepared by mixing 30 cm³ of 48% hydrofluoric acid (HF), d=1.15 g/cm3, and 30 cm³ of 29% ammonia (NH4OH) in 1600 cm³ of deionized water. The ratio of ammonium fluoride (NH4F) to hydrofluoric acid (HF) is 3/1 for a pH of 3.48.

The steps of pretreatment, stripping and post-treatment are carried out in succession with respective durations of 60 seconds on the following samples: either silicon or layers of silicon-germanium having different concentrations: 28 nm SiGe 30%—53 nm SiGe 10%—75 nm SiGe 20%—40 nm SiGe 40%—26 nm SiGe 50%.

| Samples | Etching (nm) |
| --- | --- |
| 45 nm Si | 0.9 |
| 53 nm SiGe 10% | 1.2 |
| 75 nm SiGe 20% | 2 |
| 28 nm SiGe 30% | All (28) |
| 40 nm SiGe 40% | All (40) |

The stripping of the layer of silicon is on the order to 0.9 nm while the stripping of the layer of silicon-germanium 10% is on the order of 1.2 nm. A layer of silicon-germanium 30% is completely removed, in other words 28 nm.

A selectivity on the order to 30/1 is obtained for the layer of silicon-germanium 30%. The etching rate is 120 Angstrom/minute or 12 nm/min for the silicon-germanium 30%.

By further dilution, the etching rate may be reduced if it is desired to avoid removal of the entirety of the layer of silicon-germanium. Otherwise the etching time is shortened in order to limit the stripping.

REFERENCES

1. Substrate of silicon
2. Silicon-germanium
3. Silicon oxide
4. Gate
5. Spacer
6. PMOS transistor
7. Resin
8. Etching zone
9. NMOS transistor

The invention claimed is:

1. A method for manufacturing a semiconductor device:
the device comprising:
    a layer of silicon (Si);
    a layer of silicon-germanium (SiGe); and
    a layer of photosensitive resin forming a mask partly covering the layer of silicon-germanium (SiGe) and leaving the layer of silicon-germanium uncovered in certain zones;
the process comprising:
    preparing an etching solution which comprises 49 wt % hydrofluoric acid (HF), hydrogen peroxide ($H_2O_2$), 100% acetic acid ($CH_3COOH$) and 28 wt % ammonium hydroxide ($NH_4OH$) in a ratio of 1/2/3/4 by volume, respectively; and
    exposing the uncovered layer of silicon-germanium (SiGe) to the etching solution to remove the uncovered layer of silicon germanium;
    wherein a pH of the etching solution is between 3 and 6.

2. The method according to claim 1, wherein the pH of the etching solution is between 3.5 and 4.

3. The method according to claim 1 further comprising: diluting the etching solution with deionized water by a factor of 5 to 500.

4. The method according to claim 1, wherein a duration of the exposure of the uncovered layer of silicon-germanium (SiGe) to the etching solution is between 20 seconds and 600 seconds.

5. The method according to claim 1, wherein the duration of exposure to the etching solution is between 30 seconds and 120 seconds.

6. The method according to claim 1 further comprising, before exposing the uncovered layer of silicon-germanium (SiGe) to the etching solution, a pretreatment comprising exposure of the uncovered layer of silicon-germanium (SiGe) to a pretreatment solution to facilitate startup of the removal of the uncovered SiGe.

7. The method according to claim 6 comprising preparation of a pretreatment solution from 48 wt % hydrofluoric acid (HF) and 29 wt % ammonium hydroxide ($NH_4OH$), in a ratio by volume of $NH_4F/HF$ of from 2/1 to 6/1.

8. The method according to claim 6, wherein a duration of exposure of the uncovered layer of silicon-germanium (SiGe) to the pretreatment solution is between 20 seconds and 300 seconds.

9. The method according to claim 8, wherein the duration of exposure to the pretreatment solution is between 30 seconds and 120 seconds.

10. The method according to claim 1 further comprising, after the removal of the layer of silicon-germanium (SiGe), a post-treatment exposure to a post-treatment solution to improve the surface texture of a layer exposed by removal of the SiGe by removing potential contaminants.

11. The method according to claim 10 further comprising preparation of a post-treatment solution from 48 wt % hydrofluoric acid (HF) and 29 wt % ammonium hydroxide ($NH_4OH$), in a ratio by volume of $NH_4F/HF$ of from 2/1 to 6/1.

12. The method according to claim 10, wherein a duration of exposure to the post-treatment solution is between 10 seconds and 180 seconds.

13. The method according to claim 12, wherein the duration of exposure to the post-treatment solution is between 20 seconds and 60 seconds.

14. The method according to claim 1, wherein a germanium content of the layer of silicon-germanium (SiGe) is from 5 to 60%.

15. The method according to claim 1, wherein the covered layer of silicon-germanium (SiGe) not exposed to etching forms a channel of a transistor.

16. The method according to claim 1, wherein the stripping of the layer of silicon-germanium (SiGe) (2) is implemented so that the layer of silicon-germanium (SiGe) (2) is completely removed and the layer of silicon (Si) is on the surface.

* * * * *